United States Patent [19]

Dietz

[11] 4,162,434
[45] Jul. 24, 1979

[54] REGULATOR WITH SHORT CIRCUIT PROTECTION

[75] Inventor: Wolfgang F. W. Dietz, New Hope, Pa.

[73] Assignee: RCA Corporation, New York, N.Y.

[21] Appl. No.: 849,221

[22] Filed: Nov. 7, 1977

[51] Int. Cl.² ............................................. H01J 29/70
[52] U.S. Cl. ..................................... 315/411; 315/408
[58] Field of Search ............................... 315/411, 408

[56] References Cited

U.S. PATENT DOCUMENTS

| | | | |
|---|---|---|---|
| 3,638,067 | 1/1972 | Dietz | 315/408 |
| 3,749,966 | 7/1973 | Ahrens et al. | 315/408 |
| 3,789,260 | 1/1974 | Ahrens | 315/408 X |
| 3,936,115 | 2/1976 | Dietz | 315/408 X |

Primary Examiner—Malcolm F. Hubler
Attorney, Agent, or Firm—Eugene M. Whitacre; Paul J. Rasmussen; Joseph Laks

[57] ABSTRACT

A deflection circuit coupled to a deflection winding produces scanning current in the winding. A deflection rate voltage is developed at a first terminal of the deflection circuit. A source of operating voltage supplies energy to the deflection circuit, and a sensing circuit coupled to a source of voltage representative of an energy level in the deflection circuit produces an error signal for a control circuit that provides first and second control signals. A controllable switch coupled to the source of operating voltage and the first terminal provides operating current to the deflection circuit through the controllable switch. A first portion of the deflection rate voltage, under normal conditions, commutates off the controllable switch. The first control signal, coupled to a control terminal of the switch, switches the controllable switch into conduction, for modulating, under normal operating conditions, the duration of conduction of the controllable switch during each deflection cycle, thereby regulating the supply of energy coupled to the deflection circuit. The second control signals turn off the controllable switch under fault conditions when the deflection rate voltage fails to commutate off the controllable switch prior to the occurrence of the second control signals.

20 Claims, 7 Drawing Figures

REGULATOR WITH SHORT CIRCUIT PROTECTION

BACKGROUND OF THE INVENTION

This invention relates to regulator circuits for television receivers.

In many SCR horizontal deflection circuits, energy is coupled to the deflection circuit from a source of B+ operating voltage through an input choke that is coupled to the commutating switch of the deflection circuit. Conventional regulators for these circuits have included saturable reactors, the inductance of which is controlled to achieve regulation, or have included various types of switching arrangements.

One type of prior art regulator provides for forward regulation of the input operating current. In these forward regulators, an SCR is coupled in series with the B+ supply and the input choke. A phase controlled oscillator responsive to the energy level within the deflection circuit gates the SCR into conduction during the commutating interval of each deflection cycle. The SCR is commutated off during the noncommutating interval as the voltage across the commutating switch causes the current through the input choke and the SCR to decrease below the SCR holding current level. Regulation is achieved by varying the turn-on time of the SCR, thereby controlling the amount of energy provided by the B+ supply to the deflection circuit.

Since the regulator SCR is commutated off by the commutating voltage, further circuitry functioning as a solid state circuit breaker is needed to provide short circuit protection should the commutating voltage be insufficient to turn off the SCR or should it be absent completely due to a shorted commutating switch. Prior art circuitry has included another SCR device in series between the output of the AC line rectifier circuit and the B+ filter capacitor. If the commutating voltage disappeared or too much operating current is drawn, gating signals are removed from the circuit breaker SCR, thereby open-circuiting the power supply circuit. Such protection circuitry requires two power devices capable of operating with relatively large currents flowing through them and relatively large voltages impressed across the devices. It is desirable to develop circuitry which will eliminate the need for two relatively large and expensive SCR's by combining both regulating and circuit breaker functions in a circuit requiring only a single power device.

Other prior art circuitry combines the function of forward regulation and circuit breaker protection into a single transistor device in series with the unregulated B+ supply and the input choke inductor of the SCR horizontal deflection circuit. A modulated signal coupled to the transistor base turns on the transistor during the commutating interval and then turns off the transistor during the noncommutating interval, thereby providing regulation. Should faulty operation be encountered, the base signals are removed, thereby providing circuit breaker protection.

By turning off the transistor under normal operation instead of commutating it off, that is, instead of using the commutating voltage to decrease the current in the collector-emitter transistor path to zero and reverse bias that junction, relatively large currents must flow under normal conditions when the transistor is cut off, requiring a transistor capable of withstanding this turn-off stress. Furthermore, the collector current must now be transferred to a damping snubber network undesirably dissipating the collector current even under normal conditions.

SUMMARY OF THE INVENTION

A deflection circuit coupled to a deflection winding produces scanning current in the winding. A deflection rate voltage is developed at a first terminal of the deflection circuit. A source of operating voltage supplies energy to the deflection circuit, and a sensing circuit coupled to a source of voltage representative of an energy level in the deflection circuit produces an error signal for a control circuit that provides first and second control signals. A controllable switch coupled to the source of operating voltage and the first terminal provides operating current to the deflection circuit through the controllable switch. A first portion of the deflection rate voltage, under normal conditions, commutates off the controllable switch. The first control signal, coupled to a control terminal of the switch, switches the controllable switch into conduction, for modulating, under normal operating conditions, the duration of conduction of the controllable switch during each deflection cycle, thereby regulating the supply of energy coupled to the deflection circuit. The second control signals turn off the controllable switch under fault conditions when the deflection rate voltage fails to commutate off the controllable switch prior to the occurrence of the second control signals.

DESCRIPTION OF THE INVENTION

Figure 1:
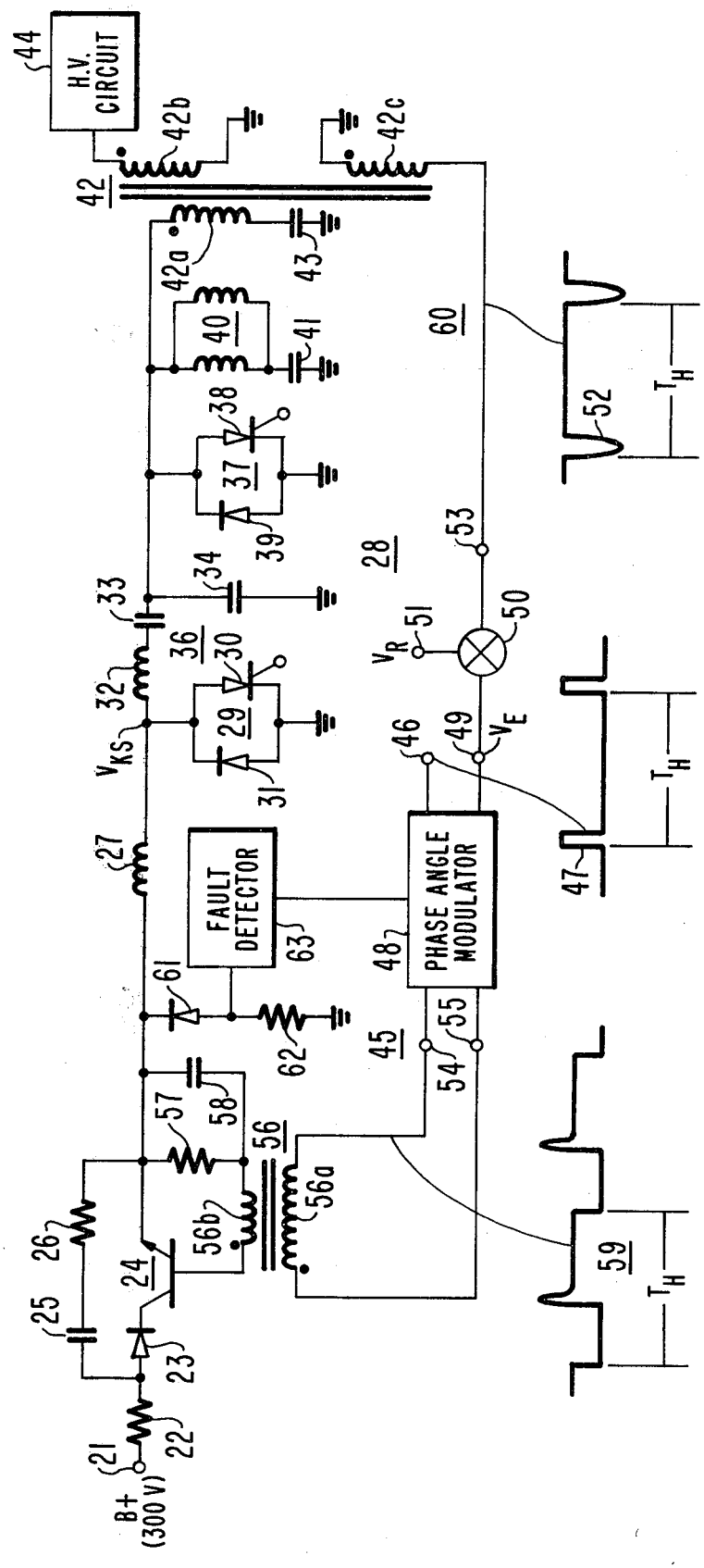
FIG. 1 illustrates a regulated deflection circuit embodying the invention.

In FIG. 1, a source of unregulated B+ voltage, illustratively shown as 300 volts DC, at an input terminal 21 is coupled through a current limiting resistor 22 and a diode 23 to an input of a switching element, illustratively shown as a regulating transistor 24 of a regulator circuit 35. The conduction of switching element 24 and the operation of regulator circuit 35 will be hereinafter described. Coupled across diode 23 and transistor 24 is a transient damping network comprising a capacitor 25 and a resistor 26. The emitter of transistor 24 is coupled to an input choke inductor 27 of a horizontal SCR deflection circuit 28.

Horizontal deflection circuit 28 comprises a commutating switch 29 comprising an SCR 30 and an oppositely poled diode 31, a reactive commutating circuit 36 comprising a commutating inductor 32 and a capacitor 33 and a retrace capacitor 34 as arranged illustratively in FIG. 1, a trace switch 37 comprising an SCR 38 and an oppositely pole diode 39, and a series combination of a horizontal deflection winding 40 and an "S" shaping capacitor 41. A series coupled primary winding 42a of a horizontal output transformer 42 and a decoupling capacitor 43 is coupled to deflection winding 40. A tertiary winding 42b is coupled to a high voltage circuit 44 for providing an ultor voltage.

Figure 2:
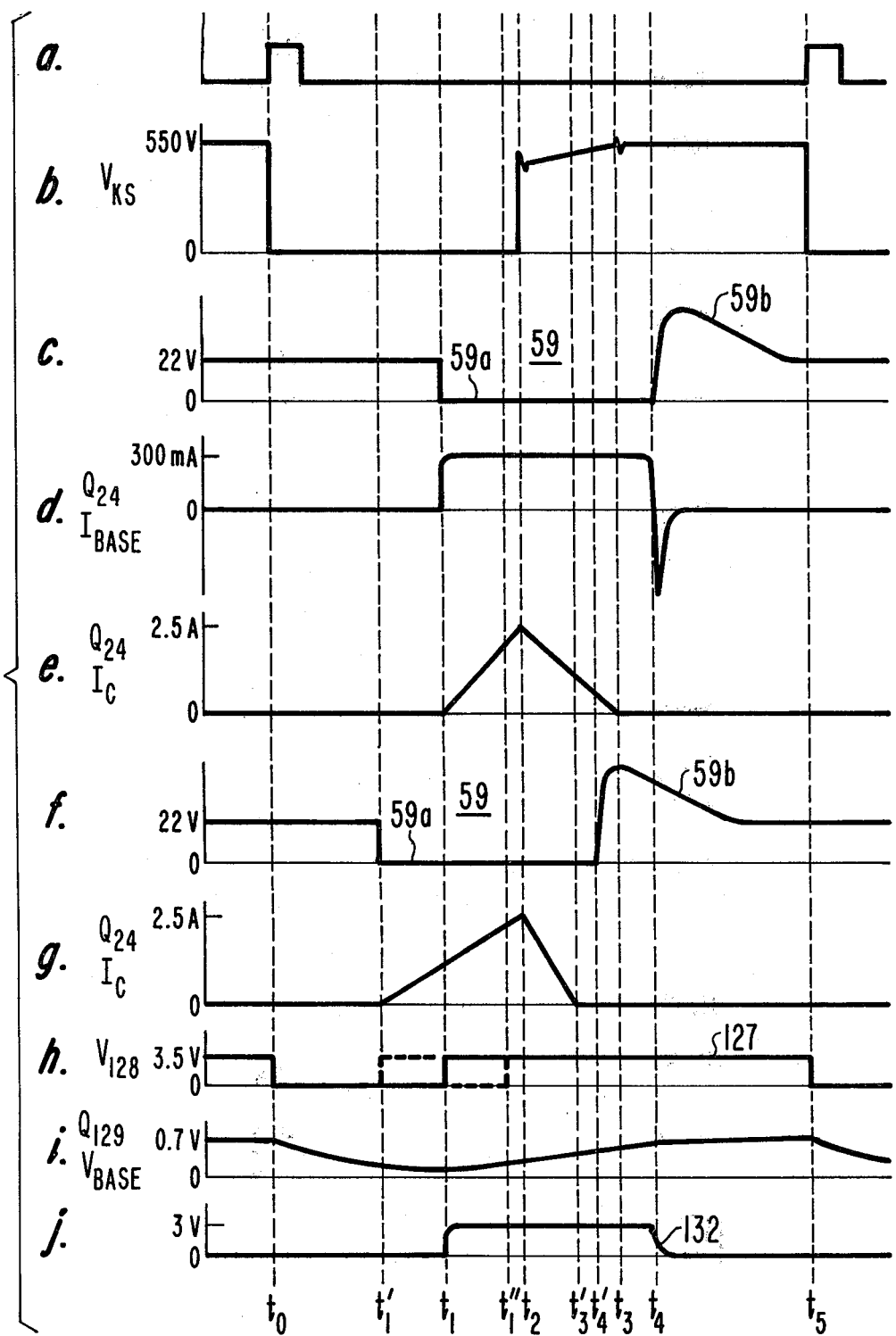
FIGS. 2 and 3 illustrate waveforms associated with the circuit of FIG. 1.

Horizontal deflection circuit 28 operates in a conventional manner. As illustrated in FIG. 2a, a gating pulse at time $T_0$, the beginning of the commutating interval, is coupled to the gate of commutating SCR 30 from horizontal oscillator circuitry, not shown, in FIG. 1. The voltage across commutating switch 29 is illustrated in FIG. 2b as $V_{KS}$ and is approximately zero volts during conduction of switch 29 during the commutating interval $t_0-t_2$.

The retrace interval begins somewhat later than time $t_0$ when trace switch 37 open circuits as the circulating currents in reactive commutating circuit 36 first cut off trace SCR 38 and then reverse bias diode 39. The trace interval begins shortly before the end of the commutating interval when trace switch 37 closes as the circulating currents in reactive commutating circuit 36 forward biases diode 39 into conduction. Towards the middle of the trace interval, a gating signal from conventional circuitry, not shown, enables trace SCR 38 for conduction at the appropriate moment.

The commutating interval ends at time $t_2$ when the circulating currents open circuit commutating switch 29 by reverse biasing diode 31. As illustrated in FIG. 2b, the noncommutating interval occurs from times $t_2-t_5$. At time $t_5$, another gating pulse is coupled to commutating SCR 30 to begin again the commutating interval.

Energy from the B+ supply is stored in input choke 27 during a portion of the commutating interval and is transferred to deflection circuit 28 during the noncommutating interval. The amount of energy stored in input choke 27 is determined by the conduction time of regulating transistor 24. Regulation is achieved by phase angle modulating the turn-on time of transistor 24 during each deflection cycle by means of a control circuit 45.

A first input terminal 46 of control circuit 45 couples synchronizing pulses 47 obtained from the horizontal oscillator circuitry to a phase angle modulator 48 of control circuit 45. An error voltage $V_E$ representative of the energy level in deflection circuit 28 is coupled to an input terminal 49. The error voltage is obtained at the output of a comparator 50 of a sensing circuit 60 which compares a reference voltage $V_R$ at a terminal 51 with a horizontal retrace pulse 52 at a terminal 53 obtained from a secondary winding 42c of horizontal output transformer 24. The magnitude of the retrace pulse 52 is a function of both the magnitude of the B+ voltage, which will vary with the AC power line fluctuations, and the ultor beam current load and other current loads coupled to the horizontal output transformer.

Drive signals 59 from phase angle modulator 48 at terminals 54 and 55 are coupled to a primary winding 56a of driver transformer 56. A secondary winding 56b of driver transformer 56 is coupled between the base and emitter of regulating transistor 24 through a shaping network comprising a resistor 57 and a capacitor 58.

As illustrated in FIGS. 2c and 2d at time $t_1$, occurring within commutating interval $t_0-t_2$, a first turn-on signal portion 59a of drive signals 59 forward biases regulating transistor 24 into a first conductive state for saturated conduction. A positive base current flows beginning at time $t_1$, as illustrated in FIG. 2d. With transistor 24 conducting, the B+ voltage is impressed across input choke 27. An increasing forward operating current flows through transistor 24 and input choke 27 for the remainder of the commutating interval $t_1-t_2$, as illustrated in FIG. 2e.

At time $t_2$, commutating switch 29 opens, and the commutating voltage $V_{KS}$ increases to substantially equal the voltage across commutating capacitor 33, neglecting the relatively small voltage drop across commutating inductor 32. An opposite polarity voltage—equal to the commutating voltage $V_{KS}$ less the B+ voltage—is developed across input choke 27 and commutates off the regulating transistor switching element 24 at time $t_3$. As illustrated in FIG. 2e, the forward operating current through transistor 24 and choke 27 decreases until at time $t_3$ the current attempts to reverse direction, at which point the transistor is commutated off. Note, that at time $t_3$, transistor 24 is still in its first conductive state since turn-on signal portion 59a of drive signal 59 still forward biases transistor 24 for conduction. However, the reverse voltage across the collector-emitter terminals of transistor 24 will not permit any forward current conduction. Diode 23 is poled to prevent reverse conduction through the base-collector path of transistor 24. At time $t_4$, a second turn-off signal portion 59b of drive signal 59 reverse biases the base-emitter terminals of transistor 24, switching the transistor into a second state, a state of nonconduction. Current can no longer flow through transistor 24 even, should the reverse bias across the collector-emitter terminals be removed. Modulator 48 is so constructed that the pulse duration $\Delta t$ from times $t_1-t_4$ of turn-on signal 59a is sufficient to extend beyond the commutating-off time $t_3$ under normal operating conditions. The desirability for such a construction will be explained further.

Phase angle modulation for regulation is achieved by pulse position modulation of turn-on signal 59a, thereby varying the turn-on time of transistor 24. Consider a situation of low AC line voltage, where the B+ voltage will be lower than the nominal B+ voltage. The magnitude of the retrace pulses decreases, causing the error voltage to change in a direction which will advance the start of first signal portion 59a towards time $t_0$, the beginning of the commutation interval. As illustrated in FIGS. 2f and 2g, start of conduction of transistor 24 occurs at time $t_1'$ advanced from time $t_1$, the start of conduction for a nominal B+ voltage.

Because the voltage impressed across choke 27 is less under low line conditions than the impressed voltage under nominal line conditions, the slope of the operating current of FIGS. 2g from times $t_1'-t_2$ is less steep than the corresponding slope in FIG. 2e. However, because the turn-on time is advanced to time $t_1'$, the peak current reached at time $t_2$, the end of the commutating interval, is substantially the same as that reached in FIG. 2e for nominal line conditions. The amount of energy stored in choke 27 is substantially the same regardless of AC line variations, thereby regulating the amount of energy supplied to deflection circuit 28.

Transistor 24 is commutated off at time $t_3'$, earlier than the previous time $t_3$, and the turn-off second signal portion 59b of drive signal 59 occurs at time $t_4'$, earlier than the previous time $t_4$. The duration $\Delta t$ of the turn-on signal 59a from times $t_1'-t_4'$, however, remains unchanged. It should be noted that a similar type of phase angle modulation occurs under conditions of varying beam current loading.

Figure 3:
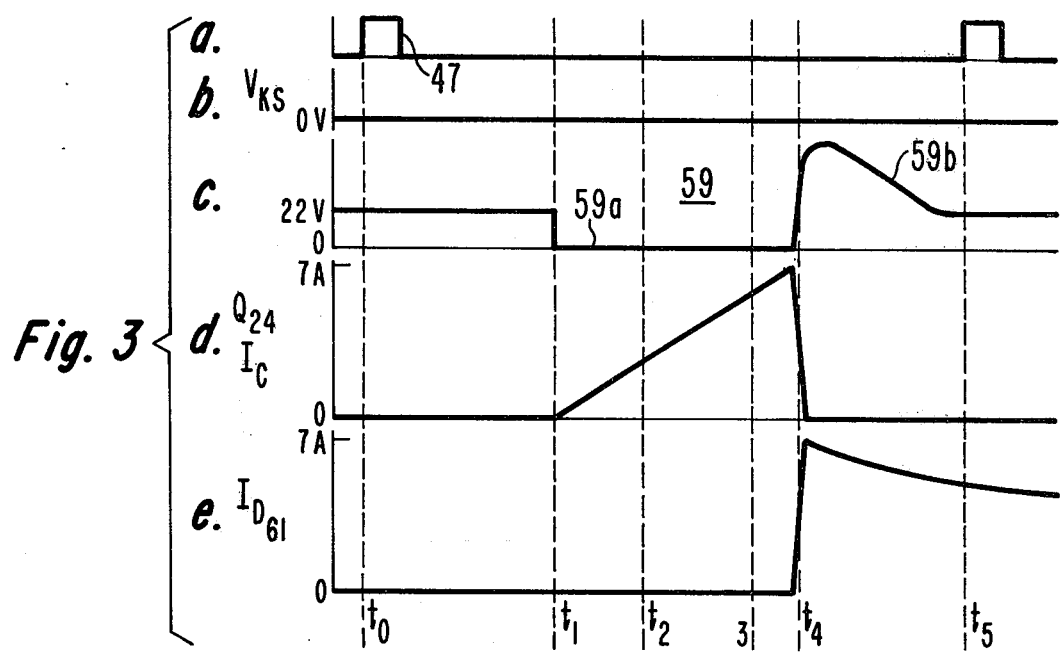

By using a switching element that is responsive to both turn-on and turn-off signals, short circuit protection may be provided without the necessity of a second power rated device, as will be now explained. Included in regulator circuit 35 is a series coupled diode 61 and a damping and feedback resistor 62. The cathode of diode 61 is coupled to the junction of choke 27 and the emitter of transistor 24. Consider, for example, a fault condition, where the commutating switch 29 fails short-circuited during operation. As illustrated in FIG. 3c, a turn-on signal 59a at time $t_1$ forward biases transistor 24 into saturated conduction, the operating current flowing in a first main conductive path comprising the collector-emitter path of transistor 24. The current through transistor 24 begins to increase, as illustrated in FIG. 3d. Because the commutating switch 29 is shorted, no commutating voltage appears at time $t_3$ to commutate off transistor 24, as illustrated in FIG. 3b. The current continues to increase, but not indefinitely. At time $t_4$, the turn-off signal 59b cuts off conduction of transistor 24 with the current in the transistor decreasing the zero shortly thereafter.

To maintain current conduction through choke inductor 27, the voltage at the cathode of diode 61 at time $t_4$ goes negative sufficiently to forward bias diode 61 to provide a second main conductive path, when the suddenly decreased current through transistor 24 causes inductor 27 to develop this polarity voltage. As illustrated by the diode current waveform of FIG. 3e, the current flows in the circulating path comprising diode 61, inductor 27, commutating switch 29 and resistor 62. After time $t_4$, the current in diode 61 exponentially decays depending on the values of resistor 62 and choke inductor 27.

A fault detection circuit 63, which may be a conventional latch arrangement, is coupled to the junction of diode 61 and resistor 62. Circuit 63 detects the negative voltage across resistor 62 under fault condition operation and provides a disabling signal to phase angle modulator 48 to remove under fault conditions the drive signals coupled to transistor 24, thereby open-circuiting the B+ supply current path.

Even if it is desired not to remove the drive signals from transistor 24, the circuit of FIG. 1 will provide for limiting the maximum amount of energy transferred by the B+ supply under short-circuit conditions. Since the turn-on time of transistor 24 is relatively constant, only a fixed amount of energy is coupled to inductor 27. This energy may be dissipated in resistor 62 during the turn-off time interval.

Furthermore, should, for example, the error voltage $V_E$ be low or missing, then regulating transistor 24 could be turned on as early as $t_0$. The current in transistor 24 and choke 27 will continue to increase until time $t_0 + \Delta t$, $\Delta t$ being the nominal turn-on portion of drive waveform 59 produced by phase angle modulator 48. At this time, the turn-off signal portion of waveform 59 will switch transistor 24 into cutoff, thereby limiting the duration in which energy is being stored in choke 27 to an interval $\Delta t$ rather than the entire commutating interval.

Figure 4:
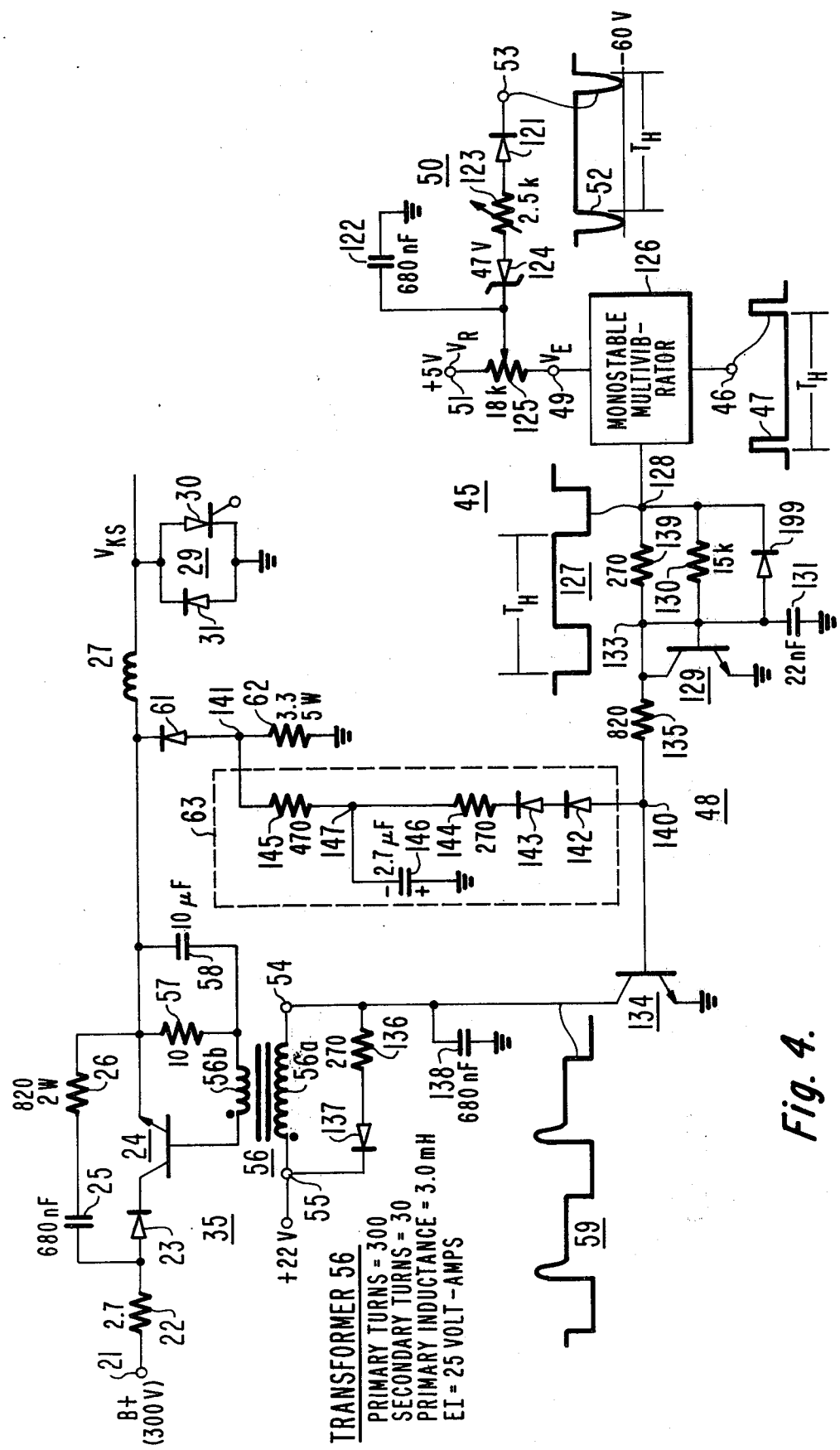
FIG. 4 illustrates another regulated deflection circuit embodying the invention.

The circuit of FIG. 4 illustrates a detailed embodiment that incorporates inventive features of FIG. 1 and provides a detection circuit 63 which will restore normal regulator operation should the fault condition only be transitory. Similar functioning elements in FIGS. 1 and 4 have been identically designated.

Negative retrace pulses 52 coupled to input terminal 53 of comparator 50 are rectified by diode 121 and coupled to a filter capacitor 122 through an adjustable peaking resistor 123 and a clipping zener diode 124. The voltage across filter capacitor 122 is added to the reference voltage $V_R$ obtained at terminal 51 by means of a resistor 125, the capacitor voltage being coupled through an adjustable arm of resistor 125. The summation voltage comprises the error voltage $V_E$ that is coupled to input terminal 49.

The error voltage at input terminal 49 is coupled to a conventional monostable multivibrator 126, as are synchronizing pulses 47 at input terminal 46. The output of monostable 126 at a terminal 128 is a horizontal deflection rate, $1/T_H$, repetitive one-shot waveform 127 with a leading positive edge, which is pulse duration modulated in accordance with the input error voltage $V_E$, as illustrated by the dotted lines of FIG. 2h. The maximum extent of modulation under normal multivibrator operation is from $t_1'-t_1''$. The duration of the positive portion of pulse 127 extends to the beginning of the next commutating interval $t_5$.

To change the pulse duration modulated pulse into a pulse position modulated one of relatively constant pulse width, pulse 127 is coupled to the base of a shaping transistor 129 through an integrating network comprising a resistor 130 and a capacitor 131. A diode 199 is coupled across resistor 130. Pulse 127 is coupled to the collector of transistor 129 through a resistor 139.

As illustrated in FIG. 2i, the voltage at the base of transistor 129 increases from time $t_1$, as capacitor 131 charges. At time $t_4$, the voltage across capacitor 131 is sufficient to forward bias transistor 129 into conduction. Transistor 129 continues to conduct, and the voltage across capacitor 131 continues to remain fairly constant until time $t_5$, at which time pulse voltage 127 at terminal 128 decreases to zero. Capacitor 131 begins to discharge through the forward resistance of diode 199, as illustrated in FIG. 2i from times $t_0-t_1$, thereby turning off transistor 129.

As illustrated by voltage waveform 132 in FIG. 2j, the voltage at terminal 133, the collector of transistor 129, is at its upper level only from times $t_1-t_4$ during the charging interval of capacitor 131. During the other intervals, the voltage at terminal 133 is zero, either because transistor 129 is conducting or because the voltage at terminal 128 is zero. Thus, since the charging interval of capacitor 131 remains unchanged, the pulse width of voltage 132 also remains unchanged, with only the starting time of the positive-going leading edge of voltage 132 being modulated, as determined by the voltage level at terminal $V_E$ of multivibrator 126.

Voltage 132 is coupled to the base of an amplifying and inverting driver transistor 134 through a resistor 135. The aforementioned drive signals 59, illustrated in FIG. 2c, are obtained at the collector of driver transistor 134 and are coupled to the primary winding 56a of driver transformer 56 for providing phase angle modulation of the conduction of regulating transistor 24. A transient damping network comprises a resistor 136 and a diode 137 coupled across primary winding 56a and a capacitor 138 coupled to the collector of driver transistor 134.

Fault detection circuit 63 is coupled between a terminal 140 at the base of driver transistor 134 and a feedback terminal 141 at the junction of diode 61 and resistor 62. Circuit 63 comprises two serially coupled diodes 142 and 143 and two serially coupled resistors 144 and 145 that are coupled between terminals 140 and 141. An integrating capacitor 146 is coupled from ground to the junction of resistors 144 and 145 at a terminal 147.

Consider a fault condition where the commutating switch 29 is short-circuited during deflection circuit operation. No commutating voltage exists to commutate off regulating transistor 24. The current in transistor 24 increases until the turn-off signal portion of drive signals 59 cut transistor 24 out of conduction. The current flow is now transferred to diode 61 and resistor 62. The feedback voltage at terminal 141 goes negative and is integrated by capacitor 146 into a negative voltage at terminal 147 of sufficient magnitude to forward bias diodes 142 and 143 into conduction for shunting base current away from driver transistor 134.

Thus, even though monostable 127 is still providing signal pulses 127 at terminal 127, these signals, provided a sufficiently large current still circulates through resistor 62, do not at any time during the deflection cycle raise the voltage at the base of transistor 134 positive enough to forward bias the transistor into conduction. No drive signals 59 are coupled to driver transformer 56, and regulator transistor 24 remains cut-off providing the short circuit protection.

Figure 5:
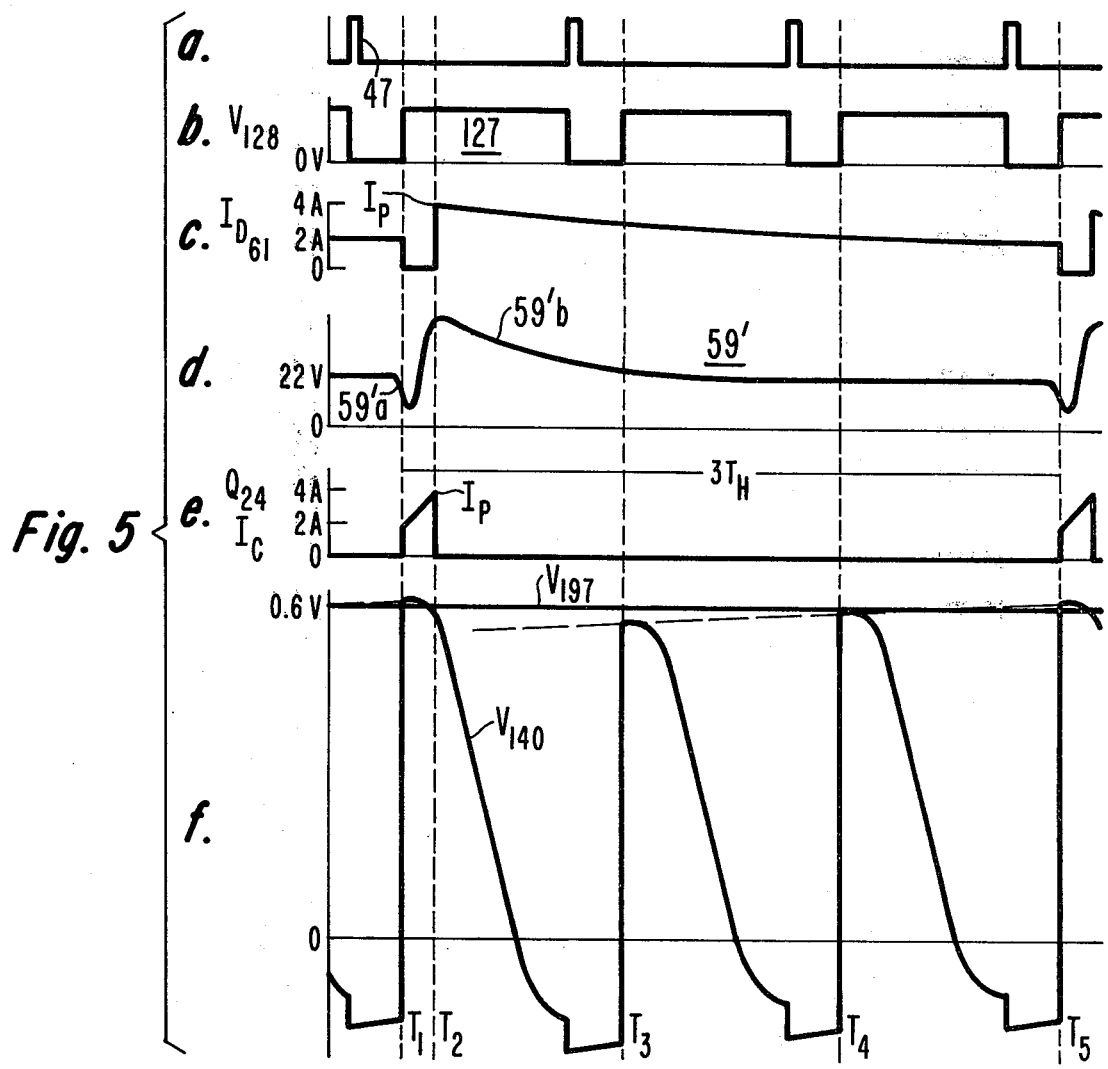
FIG. 5 illustrates waveforms associated with the circuit of FIG. 4.

As illustrated in FIG. 5c at some later point in time at time $T_1$, the exponentially decaying current through diode 61 and resistor 62 has sufficiently decreased in magnitude, and the integrated negative voltage at terminal 147 has also sufficiently decreased in magnitude to enable the leading positive edge of signal pulse 127 to forward bias driver transistor 134 into conduction, though not necessarily in a saturated condition, as illustrated by FIGS. 5b, 5d, and by FIG. 5f, which illustrates the voltage waveform $V_{140}$ at the base of transistor 134. A turn-on first signal portion 59a' of driver signal 59' is coupled to driver transformer 56 and forward biases regulating transistor 24 into conducting B+ supply current beginning at time $T_1$, as illustrated by FIGS. 5d and 5e.

The substantially B+ voltage at the emitter of transistor 24 reverse biases diode 61, and the circulating choke current and feedback voltage is removed from resistor 62. The AC voltage $V_{140}$ at the base of driver transistor 134 at terminal 140 represents the intergrated collector voltage of shaping transistor 129 and is superimposed on a slowly changing average voltage, as is illustrated by FIG. 5f. Neglecting the storage time of transistor 134, the on-time $T_1-T_2$ of transistor 134 equals the interval during which voltage $V_{140}$ exceeds $V_{197}$, the $V_{be}$ of the base-emitter junction of transistor 134, as illustrated in FIG. 5f by $V_{140}$ from times $T_1-T_2$.

During the interval $T_1-T_2$ when regulating transistor 24 is conducting, current in choke 27 increases until at time $T_2$ the current equals $I_p$. When regulating transistor 24 is turned off at time $T_2$, diode 61 conducts the choke current, and a slowly decreasing in magnitude negative feedback voltage is developed at terminal 141 and integrated by capacitor 146 into a slowly decreasing negative voltage at terminal 147.

The average voltage at terminal 140, the base of driver transistor 134, is proportional to the slowly decreasing in magnitude negative feedback voltage added proportionately with the fixed positive average voltage at terminal 133. Thus, the average voltage immediately after conduction of regulating transistor 24 is more negative than it is before conduction and is sufficiently negative at the next two instants, illustratively, at time $T_3$ and $T_4$ to maintain the positive peaks of voltage $V_{140}$ below the forward biasing level $V_{197}$ of transistor 134, as illustrated by the dotted line of FIG. 5f. Transistor 134 remains cut out of conduction until time $T_5$, when the circulating choke current has decreased sufficiently to decrease in magnitude the negative voltage at terminal 147 sufficiently to enable to positive peaks of $V_{140}$, as illustrated in FIG. 5f, to again forward bias transistor 134.

As illustrated by FIG. 5e, the conduction time of regulating transistor 24, after time $T_1$ is relatively short, lasting only from times $T_1-T_2$, the interval, neglecting storage time effects of transistor 134, in which the voltage at terminal 140 is sufficiently positive to maintain driver transistor 134 forward biased into conduction. This interval is relatively small, since a decrease of only 0.1 to 0.2 volts is typically needed to bias transistor 134 out of conduction. Short circuit protection is thereby provided, as the peak current coupled from the B+ supply through regulating transistor 24 is relatively small due to the relatively short conduction time of the transistor.

Furthermore, depending on various factors such as the L/R time constant of the circulating choke current circuit, regulating transistor 24 will conduct B+ supply current only once every several deflection cycles, with FIG. 5e illustratively showing conduction once every three deflection cycles. Short circuit protection is thus further provided by limiting the frequency that energy that can be provided by the B+ supply to once every several deflection cycles.

With the repetitive fault detection circuit operation of FIG. 4 as described, normal regulator operation can be restored should the fault condition prove to be only transitory. For example, as commutating voltage redevelops across commutating switch 29 after the transitory fault conditions have ended, diode 61 will itself eventually be commutated off when the current through the diode decreases to zero and attempts to reverse direction. Normal regulator circuit operation will return as the turn-on signals 59a bias regulating transistor 24 into conduction, and the commutating voltage $V_{KS}$ commutates the transistor off.

Should phase angle modulator 48 or horizontal deflection circuit 28 include added multivibrator circuits other than monostable 126, fault detection circuit 63 may be correspondingly modified to provide repetitive fault detection circuit operation incorporating such multivibrator circuits. For example, depending on the feedback voltage at terminal 141 of FIG. 4, a turn-on signal at time $T_1$ of FIG. 5e may be coupled to driver transistor 134 by multivibrator 126, and a turn-off signal at time $T_2$ may be coupled by the additional multivibrator circuit.

Figure 6:
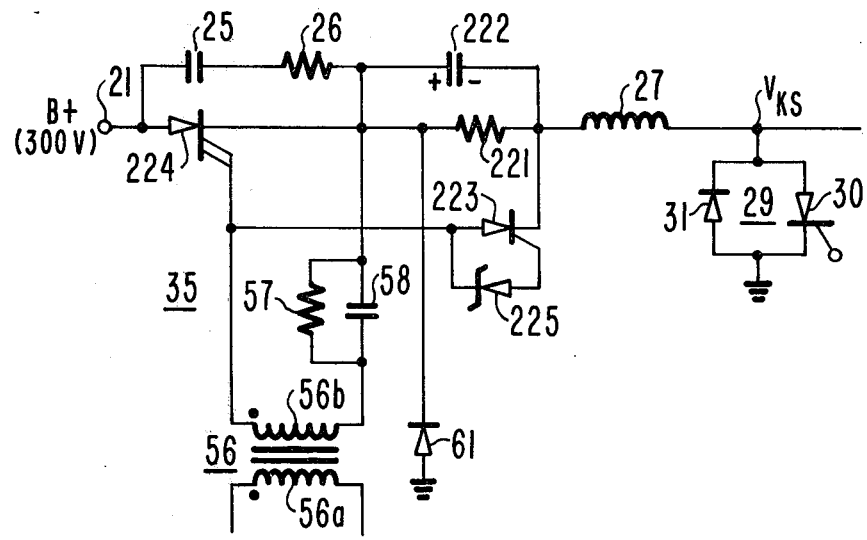
FIGS. 6 and 7 illustrate other regulator circuit portions embodying the invention.

Regulator switching element 24 need not be a transistor but may be any device, such as a gate turn-off (GTO) thyristor, an anode-to-cathode main conductive path capable of carrying operating current and capable of switching to conductive and nonconductive states in response to respective turn-on and turn-off signals coupled to a control terminal of the device. FIG. 6 illustrates the regulator portion 35 of a horizontal deflection circuit embodying a GTO 224 as the switching element. The circuit of FIG. 6 functions in part also to turn off GTO 224 under current overload conditions.

A current sensing resistor 221 is coupled to the cathode of GTO 224 and to choke inductor 27. A filter capacitor 222 is coupled across resistor 221. An SCR 223 is coupled between the gate electrode of GTO 224 and the junction of resistor 221 and choke 27. The cathode of a zener diode 225 is coupled to the gate of GTO 224, and the anode of zener diode 225 is coupled to the gate of SCR 223.

Should the current in resistor 221 increase beyond a predetermined amount, the voltage across zener diode 225 exceeds its breakdown voltage coupling a voltage to the gate of SCR 223 that is positive with respect to the cathode of SCR 223, gating SCR 223 into conduction. With SCR 223 conducting, the gate of GTO 224 becomes more negative than the GTO cathode, gating GTO 224 nonconductive, thereby providing circuit breaker protection under current overload conditions.

Figure 7:
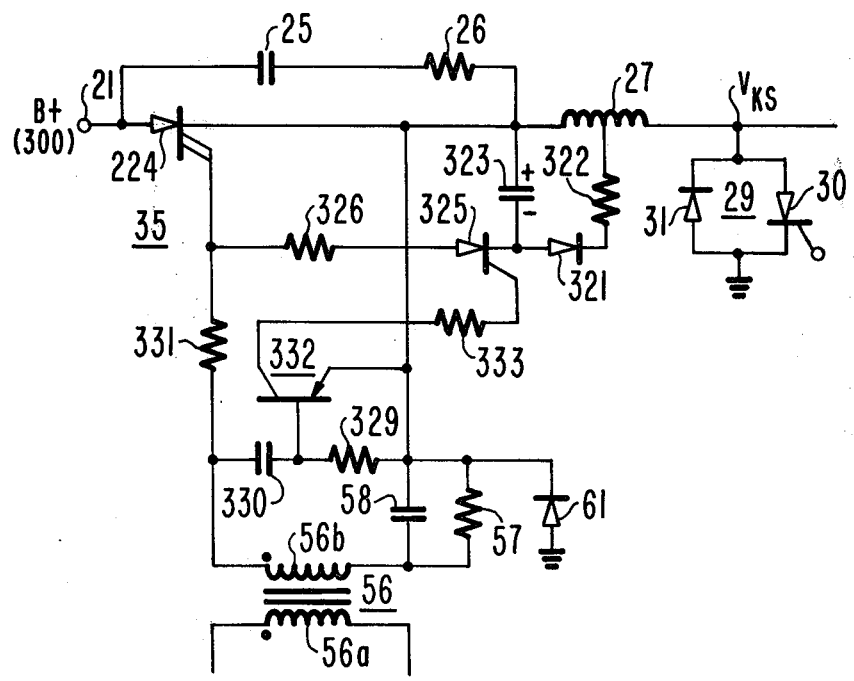

The circuit of FIG. 7 discloses a portion of regulator circuit 35 which will provide a relatively large turn-off current that certain types of GTO or Darlington devices may need. The voltage across a tapped portion of choke inductor 27 is coupled to a diode 321 through a resistor 322 and is rectified during the commutating interval and filtered by a capacitor 323. One terminal of capacitor 323 is coupled to the cathode of GTO 224, and the other terminal is coupled to the gate of GTO 224 through an SCR 325 and a resistor 326.

The dotted terminal of secondary winding 56b is coupled to resistor 326 through a resistor 331. The base and emitter of a transistor 332 are coupled across a resistor 329. The collector of transistor 332 is coupled to the gate of SCR 325 through a resistor 333.

When a turn-off signal is coupled to secondary winding 56b of driver transformer 56, the undotted terminal becomes positive with respect to the dotted terminal. Transistor 332 becomes forward biased. The collector of transistor 332 couples a voltage to the gate of SCR 325 that is positive with respect to the voltage at the SCR cathode, gating the SCR into conduction. With SCR 325 conducting, capacitor 323 discharges through the cathode-gate path of GTO 224, thereby providing a large turn-off current which switches GTO 224 into nonconduction.

It should be noted that the circuits in FIGS. 1, 4, 6 and 7 may be constructed in an AC line isolated manner with the regulating transistor or GTO coupled to the primary and the commutating switch coupled to the secondary. In such a configuration, input choke 27 may be omitted with the leakage inductance performing the same function.

What is claimed is:

1. A regulated deflection circuit, comprising:
a deflection winding;
a deflection circuit coupled to said deflection winding for producing scanning current in said deflection winding, a first terminal of said deflection circuit having developed thereat a deflection rate voltage;
a source of operating voltage for supplying energy to said deflection circuit;
first sensing means coupled to a source of voltage representative of an energy level in said deflection circuit for producing an error signal;
control means responsive to said error signal for providing first and second control signals; and
controllable switching means coupled to said source of operating voltage and said first terminal for providing operating current to said deflection circuit through said controllable switching means, a control terminal of said controllable switching means coupled to said control means, a first portion of said deflection rate voltage commutating off said controllable switching means, said first control signal switching said controllable switching means into conduction for modulating under normal operating conditions the duration of conduction of said controllable switching means during each deflection cycle, thereby regulating the supply of energy coupled to said deflection circuit, said second control signal turning off said controllable switching means under fault conditions when said deflection rate voltage fails to commutate off said controllable switching means prior to the occurrence of said second control signal.

2. A circuit according to claim 1, including a second switching means coupled to said controllable switching means for conducting said operating current when said second control signal turns off said controllable switching means.

3. A circuit according to claim 2, including damping means coupled to said second switching means for damping said operating current when said second switching means conducts said operating current.

4. A circuit according to claim 2, including a current sensing means coupled to said controllable switching means and responsive to said operating current for providing a turn-off signal to said controllable switching means when said operating current exceeds a predetermined magnitude.

5. A circuit according to claim 2, including second sensing means coupled to said second switching means for providing a fault detection signal for detecting said fault conditions.

6. A circuit according to claim 5, including a disabling circuit coupled to said second sensing means for providing a disabling signal for disabling normal television receiver operation under said fault conditions.

7. A circuit according to claim 5, including a disabling circuit coupled to said control means and responsive to said fault detection signal for removing said first control signal from said control terminal for preventing conduction of said controllable switching means for at least a substantial period during which said fault conditions occur.

8. A circuit according to claim 7, wherein said fault detecting signal comprises a feedback voltage representative of the current flowing through said second switching means, said disabling circuit removing said first control signal for a period determined by said feedback voltage.

9. A circuit according to claim 2, wherein said controllable switching means comprises a transistor, a collector-emitter path of said transistor coupled in series with said source of operating voltage and said first terminal.

10. A circuit according to claim 2, wherein said controllable switching means comprises a gate turn-off device, an anode-to-cathode path coupled in series with said source of operating voltage and said first terminal.

11. A circuit according to claim 10, including a third switching means coupled in series with a capacitance and a cathode-to-gate path of said gate turn-off device, said third switching means discharging said capacitance through said cathode-to-gate path in response to said second control signal for turning off said gate turn-off device.

12. A circuit according to claim 10, including current sensing means coupled to one of a gate and cathode of said gate turn-off device and responsive to said operating current for turning off said gate turn-off device when said operating current exceeds a predetermined magnitude.

13. A regulated deflection circuit, comprising:

a deflection winding;

a deflection circuit coupled to said deflection winding for producing scanning current in said deflection winding;

a source of operating current for supplying energy to said deflection circuit;

an impedance coupled to said deflection circuit, a deflection rate voltage being developed across said impedance;

sensing means coupled to a source of voltage representative of an energy level in said deflection circuit for producing an error signal;

control means responsive to said error signal for providing first and second control signals;

controllable switching means coupled in series with said source of operating current and said impedance for regulating the supply of energy to said deflection circuit, a control terminal of said controllable switching means coupled to said control means, a first portion of said deflection rate voltage commutating off said controllable switching means under normal operating conditions, said first control signal switching said controllable switching means into conduction for controlling under normal operating conditions the duration of conduction of said controllable switching means during each deflection cycle, thereby regulating the supply of energy coupled to said deflection circuit, said second control signal turning off said controllable switching means under fault conditions when said deflection rate voltage fails to commutate off said controllable switching means prior to the occurrence of said second control signal; and first means coupled to said impedance for conducting said operating current and for providing a fault signal when said second control signal turns off said controllable switching means when said deflection rate voltage fails to commutate off said controllable switching means prior to the occurrence of said second control signal.

14. A circuit according to claim 13, wherein said control means position modulates said first control signal.

15. A circuit according to claim 13, wherein said first means comprises a second switch coupled to a second impedance for conducting and damping said operating current when said second control signal turns off said controllable switching means, said fault signal being developed across said second impedance.

16. A circuit according to claim 15, wherein said control means comprises driving means for developing said first and second control signals at an output terminal, and modulating means coupled to an input terminal of said driving means and responsive to said error signal for providing a modulating signal for modulating at least said first control signal for providing regulation.

17. A circuit according to claim 16, including disabling means coupled to said input terminal and said first means for diabling said modulating signal at said input terminal when said fault signals exceed a predetermined value.

18. A circuit according to claim 17, wherein said disabling means comprises means for integrating said fault signal for providing a relatively slowly varying voltage upon which to superimpose said modulating signal.

19. A circuit according to claim 18, wherein said modulating signal provides a shortened conduction interval for said controllable switching means under fault conditions.

20. A deflection regulator circuit, comprising:

a deflection winding;

a deflection circuit coupled to said deflection winding for producing scanning current in said deflection winding;

a source of operating current for supplying energy to said deflection circuit;

an impedance coupled to said deflection circuit across which impedance there is developed an alternating polarity deflection rate voltage;

a first controllable switch comprising a main conductive path through which said operating current flows and a control terminal responsive to modulated control signals for controlling the conduction of said main conductive path, said main conductive path series coupled with said source and said impedance;

sensing means coupled to a source of voltage representative of an energy level in said deflection circuit for providing an error signal; and control means coupled to said first controllable switch and responsive to said error signal for providing said modulated control signals, for regulating the amount of energy supplied to said deflection circuit, a first portion of said control signals switching conduction of said main conductive path into conduction, a first polarity of said deflection rate voltage decreasing said operating current in said main conductive path sufficiently to decouple said source of operating current from said deflection circuit at least under normal operating conditions, a second portion of said control signals switching conduction of said main conductive path out of conduction for decoupling said source of operating current from said deflection circuit only under fault operating conditions.

* * * * *

UNITED STATES PATENT AND TRADEMARK OFFICE
CERTIFICATE OF CORRECTION

PATENT NO. : 4,162,434

DATED : July 24, 1979

INVENTOR(S) : Wolfgang F. W. Dietz

It is certified that error appears in the above-identified patent and that said Letters Patent is hereby corrected as shown below:

Column 3, line 5, "$T_0$" should read -- $t_0$ --. Column 5, line 18, "decreasing the" should read -- decreasing to --. Column 12, line 6, "diabling" should read -- disabling --.

Signed and Sealed this

Twentieth Day of November 1979

[SEAL]

Attest:

RUTH C. MASON
*Attesting Officer*

LUTRELLE F. PARKER
*Acting Commissioner of Patents and Trademarks*